(12) United States Patent
Fumitake

(10) Patent No.: US 9,543,390 B2
(45) Date of Patent: Jan. 10, 2017

(54) TRANSISTOR HAVING A HETEROJUNCTION AND MANUFACTURING METHOD THEREOF

(71) Applicant: Semiconductor Manufacturing International (Shanghai) Corporation, Shanghai (CN)

(72) Inventor: Mieno Fumitake, Shanghai (CN)

(73) Assignee: Semiconductor Manufacturing International (Shanghai) Corporation (CN)

( * ) Notice: Subject to any disclaimer, the term of this patent is extended or adjusted under 35 U.S.C. 154(b) by 0 days.

(21) Appl. No.: 14/513,792

(22) Filed: Oct. 14, 2014

(65) Prior Publication Data

US 2015/0249148 A1    Sep. 3, 2015

(30) Foreign Application Priority Data

Mar. 3, 2014    (CN) .......................... 2014 1 0073625

(51) Int. Cl.

| H01L 29/66 | (2006.01) |
|---|---|
| H01L 29/16 | (2006.01) |
| H01L 29/08 | (2006.01) |
| H01L 29/267 | (2006.01) |
| H01L 29/735 | (2006.01) |
| H01L 29/10 | (2006.01) |
| H01L 29/165 | (2006.01) |

(52) U.S. Cl.
CPC ....... *H01L 29/1608* (2013.01); *H01L 29/0808* (2013.01); *H01L 29/0817* (2013.01); *H01L 29/0821* (2013.01); *H01L 29/1008* (2013.01); *H01L 29/267* (2013.01); *H01L 29/6625* (2013.01); *H01L 29/735* (2013.01); *H01L 29/165* (2013.01)

(58) Field of Classification Search
None
See application file for complete search history.

(56) References Cited

U.S. PATENT DOCUMENTS

| 2006/0043529 A1* | 3/2006 | Chidambarrao .... H01L 29/7378 257/565 |
| 2007/0182478 A1* | 8/2007 | Mun .......................... G05F 3/30 327/539 |
| 2013/0299944 A1* | 11/2013 | Lai .................... H01L 29/66166 257/586 |

OTHER PUBLICATIONS

T. Sugii et al., "Beta-SiC/Si Heterojunction Bipolar Transistors with High Current Gain", EDL vol. 9, No. 2, 1988.

* cited by examiner

*Primary Examiner* — Julio J Maldonado
*Assistant Examiner* — Cory Eskridge
(74) *Attorney, Agent, or Firm* — Innovation Counsel LLP

(57) ABSTRACT

A transistor includes a semiconductor substrate comprising a first region and a second region. The transistor further includes an emitter and a base disposed on the first region, and a collector disposed on the second region. The emitter includes a heterojunction. The heterojunction is at a same height as a junction between two different insulating materials that separate the emitter and the base.

20 Claims, 16 Drawing Sheets

TRANSISTOR HAVING A HETEROJUNCTION AND MANUFACTURING METHOD THEREOF

CROSS-REFERENCE TO RELATED APPLICATION

This application claims priority to Chinese Patent Application No. 201410073625.0 filed on Mar. 3, 2014, the disclosure of which is incorporated herein by reference in its entirety.

BACKGROUND

Technical Field

The present disclosure generally relates to a transistor and a manufacturing method thereof. More particularly, the present disclosure relates to a transistor having a wide bandgap emitter and a manufacturing method thereof.

Description of the Related Art

As semiconductor technology advances, there is a need to develop more high-performance transistors in CMOS (Complementary Metal-Oxide-Semiconductor) fabrication process.

FIG. 1 illustrates a conventional transistor structure. As shown in FIG. 1, the conventional transistor may include an N-well (NW) and a P-well (PW) formed in a semiconductor substrate. An emitter and a base are formed on the N-well, and a collector is formed on the P-well. The emitter, base, and collector are spaced apart from each by an insulating material disposed therebetween. In the example of FIG. 1, an ion implantation process is performed on the regions corresponding to the emitter and the collector, so as to form a P+ region. Similarly, an ion implantation process is performed on the region corresponding to the base, so as to form an N+ region.

However, the conventional transistor of FIG. 1 does not provide superior performance, and therefore is unable to meet current semiconductor technology needs.

SUMMARY

The present disclosure addresses some of the deficiencies in conventional transistor structures.

According to some embodiments of the inventive concept, a transistor is provided. The transistor includes a semiconductor substrate comprising a first region and a second region; an emitter and a base disposed on the first region; and a collector disposed on the second region.

In some embodiments, the first region may be doped with an n-type impurity and the second region may be doped with a p-type impurity, the base may be doped with the n-type impurity, and a concentration of the n-type impurity in the base may be higher than a concentration of the n-type impurity in the first region.

In some embodiments, the collector may be doped with the p-type impurity, and a concentration of the p-type impurity in the collector may be higher than a concentration of the p-type impurity in the second region.

In some embodiments, the base may include phosphorous-doped silicon carbide and the emitter may include boron-doped silicon germanium.

In some embodiments, the collector may include the boron-doped silicon germanium.

In some embodiments, the first region may be doped with a p-type impurity and the second region may be doped with an n-type impurity, the base may be doped with the p-type impurity, and a concentration of the p-type impurity in the base may be higher than a concentration of the p-type impurity in the first region.

In some embodiments, the collector may be doped with the n-type impurity, and a concentration of the n-type impurity in the collector may be higher than a concentration of the n-type impurity in the second region.

In some embodiments, the emitter may include phosphorous-doped silicon carbide.

In some embodiments, the first region may be doped with a p-type impurity and the second region may be doped with an n-type impurity; and the emitter may include boron-doped silicon germanium.

In some embodiments, the base may include phosphorous-doped silicon carbide.

In some embodiments, the collector may include the boron-doped silicon germanium.

According to some other embodiments of the inventive concept, a method of manufacturing a transistor is provided. The method includes forming a first region and a second region on a semiconductor substrate; forming an emitter on the first region and a collector on the second region; and forming a base on the first region.

In some embodiments, the first region may be doped with an n-type impurity and the second region may be doped with a p-type impurity, the base may be doped with the n-type impurity, and a concentration of the n-type impurity in the base may be higher than a concentration of the n-type impurity in the first region.

In some embodiments, the collector may be doped with the p-type impurity, and a concentration of the p-type impurity in the collector may be higher than a concentration of the p-type impurity in the second region.

In some embodiments, the base may include phosphorous-doped silicon carbide, and the collector and the emitter may include boron-doped silicon germanium.

In some embodiments, the first region may be doped with a p-type impurity and the second region may be doped with an n-type impurity; and the emitter may include phosphorus-doped silicon carbide.

In some embodiments, the base may be doped with the p-type impurity, and a concentration of the p-type impurity in the base may be higher than a concentration of the p-type impurity in the first region.

In some embodiments, the collector may be doped with the n-type impurity, and a concentration of the n-type impurity in the collector may be higher than a concentration of the n-type impurity in the second region.

According to some further embodiments of the inventive concept, a method of manufacturing a transistor is provided. The method includes forming a first region and a second region on a semiconductor substrate, wherein the first region is doped with a p-type impurity and the second region is doped with an n-type impurity; forming an emitter on the first region and a collector on the second region, wherein the emitter includes boron-doped silicon germanium; and forming a base on the first region.

In some embodiments, the base may include phosphorous-doped silicon carbide and the collector may include the boron-doped silicon germanium.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

It is noted that in the accompanying drawings, for convenience of description, the dimensions of the components shown may not be drawn to scale. Also, same or similar reference numbers between different drawings represent the same or similar components.

DETAILED DESCRIPTION

Figure 1:
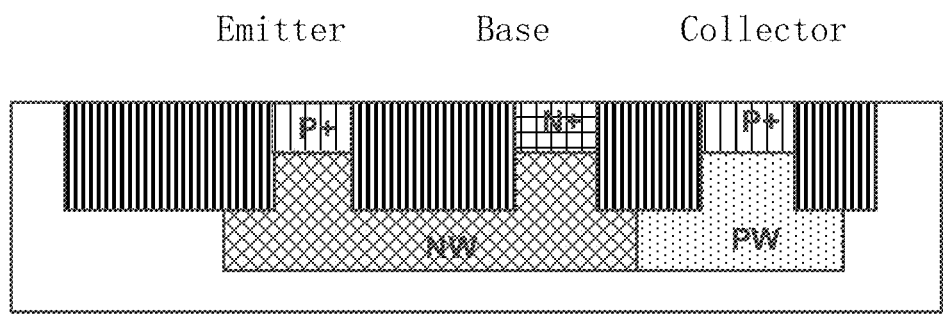
FIG. 1 illustrates a schematic cross-sectional view of a conventional transistor structure in the prior art.

Various embodiments of the inventive concept are next described with reference to the accompanying drawings. It is noted that the following description of the different embodiments is merely illustrative in nature, and is not intended to limit the inventive concept, its application, or use. The relative arrangement of the components and steps, and the numerical expressions and the numerical values set forth in these embodiments do not limit the scope of the inventive concept unless otherwise specifically stated. In addition, techniques, methods, and devices as known by those skilled in the art, although omitted in some instances, are intended to be part of the specification where appropriate. It should be noted that for convenience of description, the sizes of the elements in the drawings may not be drawn to scale.

In the drawings, the sizes and/or relative sizes of layers and regions may be exaggerated for clarity. Like reference numerals denote the same elements throughout.

It should be understood that the inventive concept is not limited to the embodiments described herein. Rather, the inventive concept may be modified in different ways to realize different embodiments.

Figure 2:
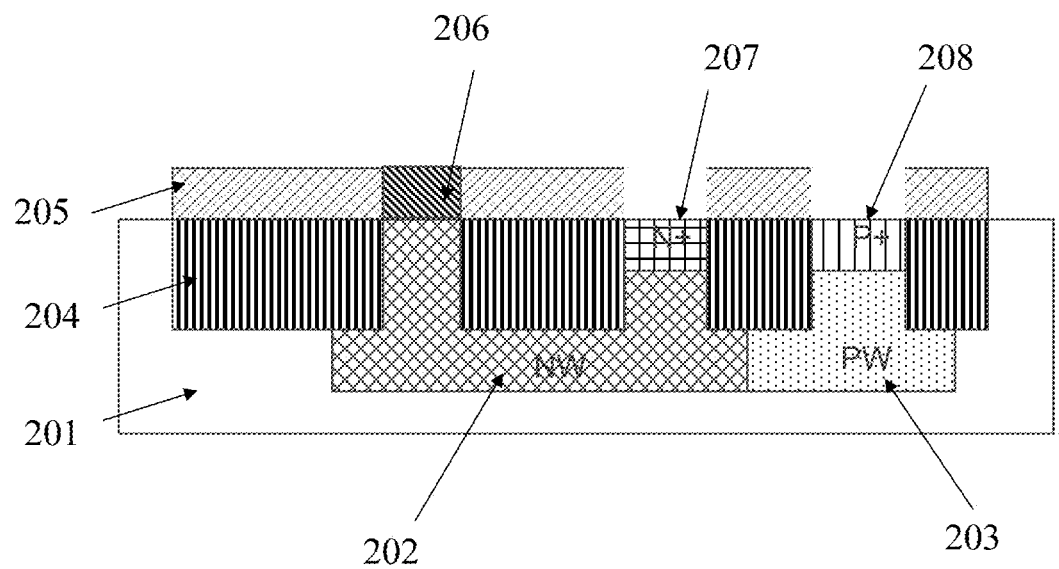
FIG. 2 illustrates a schematic cross-sectional view of a transistor according to an embodiment of the inventive concept.

FIG. 2 illustrates a schematic cross-sectional view of a transistor according to an embodiment of the inventive concept. Specifically, FIG. 2 illustrates a schematic cross-sectional view of an exemplary heterojunction bipolar transistor structure.

Referring to FIG. 2, an N-well (NW) 202 and a P-well (PW) 203 are formed in a semiconductor substrate 201. An emitter 206 and a base 207 are formed on the N-well 202, and a collector 208 is formed on the P-well 203. In the example of FIG. 2, the base 207 and the collector 208 are formed by an ion implantation process, and the emitter 206 is formed by depositing a boron-doped silicon-germanium material on a portion of the N-well 202. Accordingly, a heterojunction is formed between the emitter 206 (silicon-germanium material) and the N-well 202.

FIGS. 3A to 3F are schematic cross-sectional views of the transistor of FIG. 2 at different stages of fabrication according to an exemplary method of manufacturing the transistor of FIG. 2.

Figure 3A:
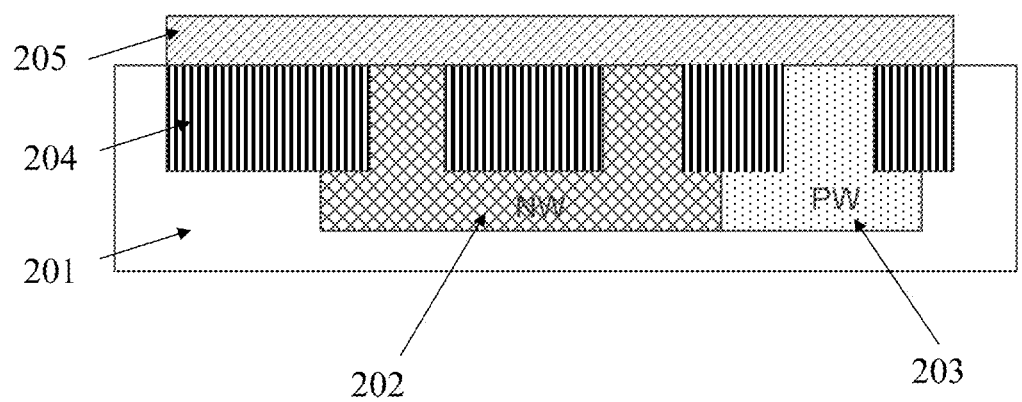
FIGS. 3A to 3F are schematic cross-sectional views of the transistor of FIG. 2 at different stages of fabrication according to an exemplary method of manufacturing the transistor of FIG. 2.

As shown in FIG. 3A, the N-well (NW) 202 and the P-well (PW) 203 are formed in the semiconductor substrate 201. The emitter 206, the base 207, and the collector 208 are to be spaced apart with an insulating material 204 disposed therebetween. A layer of insulating material 205 (e.g., silicon oxide) is deposited over the semiconductor substrate 201. Since the N-well 202, P-well 203, and insulating materials 204/205 can be formed using processes known to those of ordinary skill in the art, further description of those processes shall be omitted.

Figure 3B:
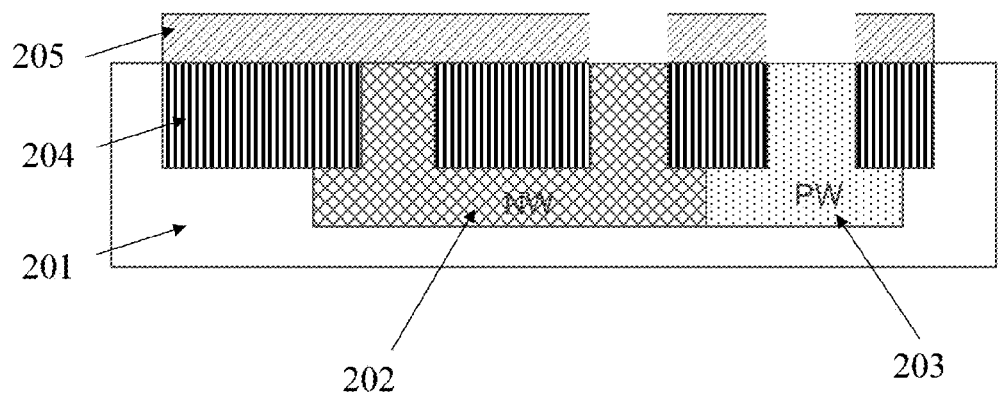

Next, referring to FIG. 3B, portions of the insulating material 205 are removed at regions corresponding to the (to-be-formed) base 207 and collector 208. The portions of the insulating material 205 can be removed using appropriate etching methods, such as dry etching or wet etching.

Figure 3C:
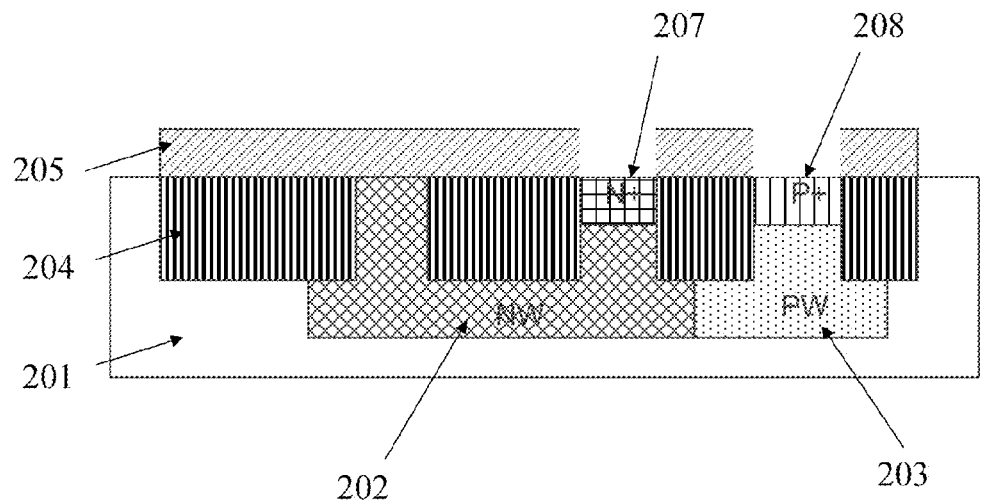

Next, referring to FIG. 3C, the base 207 and the collector 208 are formed by an ion implantation process. After the ion implantation process, the concentration of the n-type impurity in the base 207 is higher than the concentration of the n-type impurity in the N-well 202, and the concentration of the p-type impurity in the collector 208 is higher than the concentration of the p-type impurity in the P-well 203. As shown in FIG. 3C, the base 207 and the collector 208 are denoted by N+ and P+ regions, respectively.

Figure 3D:
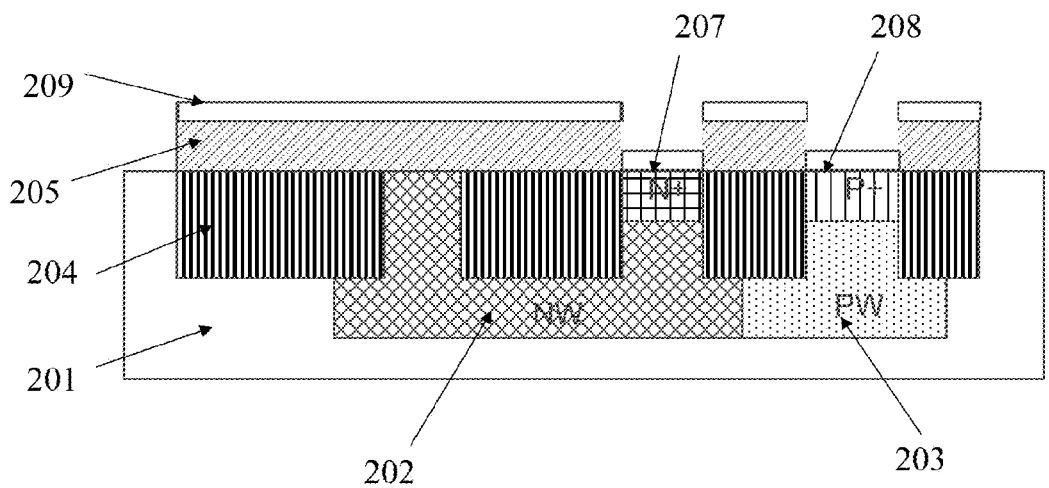

Next, referring to FIG. 3D, a mask layer 209 is deposited over the semiconductor substrate 201. Specifically, the mask layer 209 is deposited on the etched insulating material 205, and on the base 207 and collector 208.

Figure 3E:
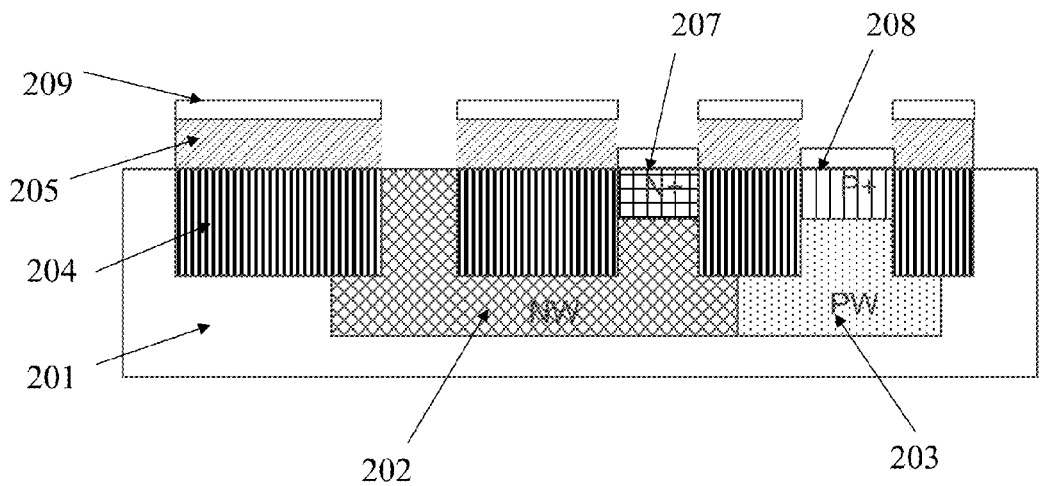

Next, referring to FIG. 3E, a portion of the mask layer 209 and the insulating material 205 is removed at a region corresponding to the (to-be-formed) emitter 206. The portion of the mask layer 209 and the insulating material 205 may be removed, for example, by an etching process.

Figure 3F:
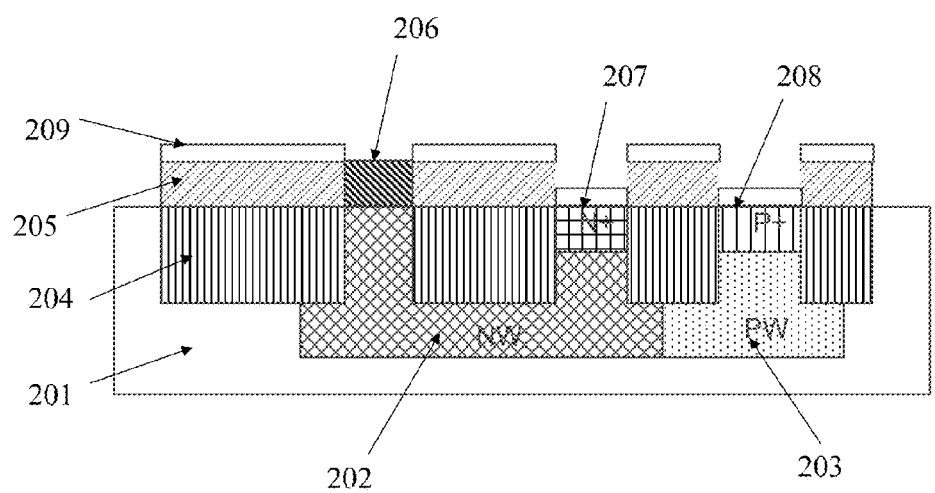

Next, referring to FIG. 3F, a boron-doped silicon germanium material is deposited on the exposed portion of the N-well 202, so as to form the emitter 206. Accordingly, a heterojunction is formed between the emitter 206 and the semiconductor substrate 201, thereby resulting in a heterojunction bipolar transistor.

The heterojunction bipolar transistor of FIG. 2 may be modified as described in the following embodiments, so as to further improve the performance of the heterojunction bipolar transistor, and for better compatibility with CMOS processes in the manufacture of SOCs (System-On-Chip).

Figure 4:
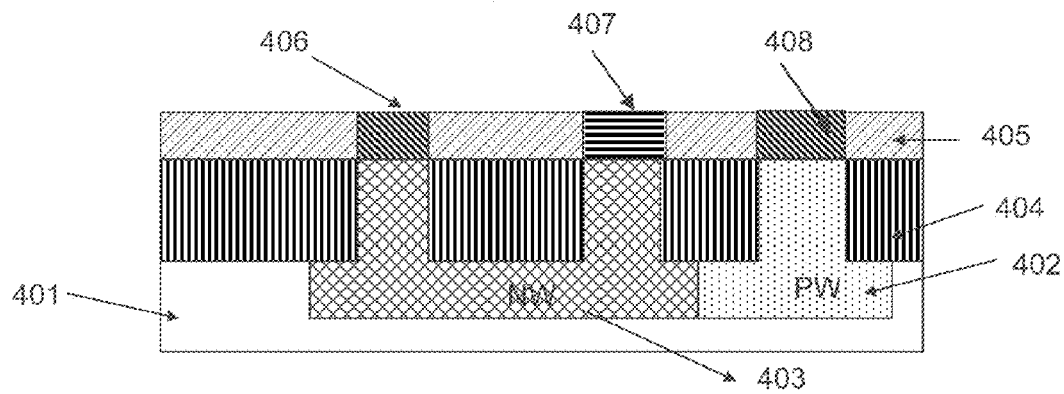
FIG. 4 illustrates a schematic cross-sectional view of a transistor according to another embodiment of the inventive concept.

FIG. 4 illustrates a schematic cross-sectional view of a heterojunction bipolar transistor structure according to another embodiment of the inventive concept.

Referring to FIG. 4, the heterojunction bipolar transistor includes an N-well (NW) 403 and a P-well (PW) 402 formed in a semiconductor substrate 401. An emitter 406 and a base 407 are formed on the N-well 403, and a collector 408 is formed on the P-well 402. The emitter 406, the base 407, and the collector 408 are formed spaced apart with insulating materials 404/405 disposed therebetween. In the example of FIG. 4, the emitter 406 and the collector 408 may include a boron-doped silicon germanium material, and the base 407 may include phosphorus-doped SiC. Accordingly, a heterojunction is formed between the emitter 406 and the N-well 403. Similarly, a heterojunction is formed between the base 407 and the N-well 403, and a heterojunction is formed between the collector 408 and the P-well 402.

In the example of FIG. 4, heterojunctions are formed between the emitter 406, base 407, and the collector 408, and their respective wells, thereby improving transistor performance. Furthermore, based on the method depicted in FIGS. 5A to 5E, those skilled in the art would readily appreciate that the transistor structure of FIG. 4 can be easily integrated into (or combined with) a CMOS process for fabricating SOCs.

FIGS. 5A to 5E are schematic cross-sectional views of the heterojunction bipolar transistor of FIG. 4 at different stages of fabrication according to an exemplary method of manufacturing the transistor of FIG. 4.

Figure 5A:
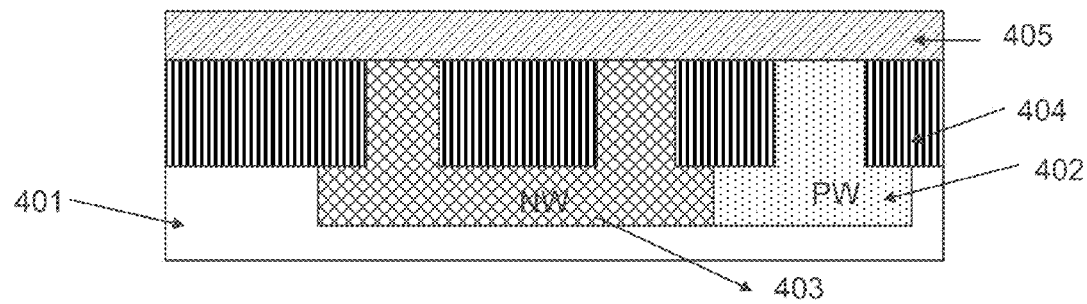
FIGS. 5A to 5E are schematic cross-sectional views of the transistor of FIG. 4 at different stages of fabrication according to an exemplary method of manufacturing the transistor of FIG. 4.

As shown in FIG. 5A, the N-well (NW) 403 and the P-well (PW) 402 are formed in the semiconductor substrate 401. The emitter 406, the base 407, and the collector 408 are to be spaced apart with the insulating material 404 disposed therebetween. The layer of insulating material 405 (e.g., silicon oxide) is deposited over the semiconductor substrate 401. Since the N-well 403, P-well 402, and insulating materials 404/405 can be formed using processes known to those of ordinary skill in the art, further description of those processes shall be omitted.

Figure 5B:
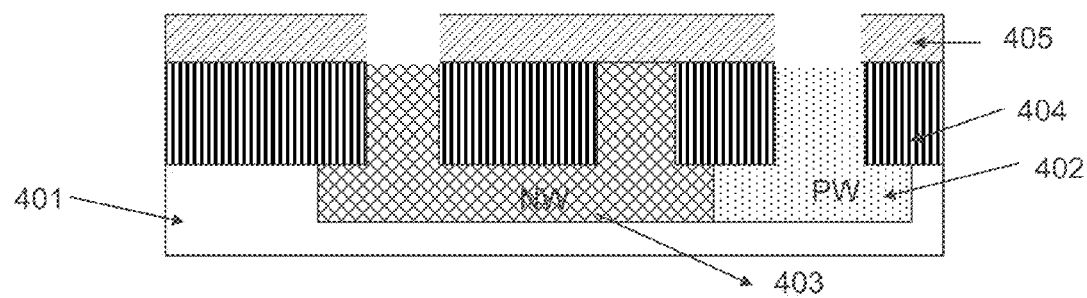

Next, referring to FIG. 5B, portions of the insulating material 405 are removed at regions corresponding to the (to-be-formed) emitter 406 and collector 408. The portions of the insulating material 405 can be removed using appropriate etching methods, such as dry etching or wet etching.

Figure 5C:
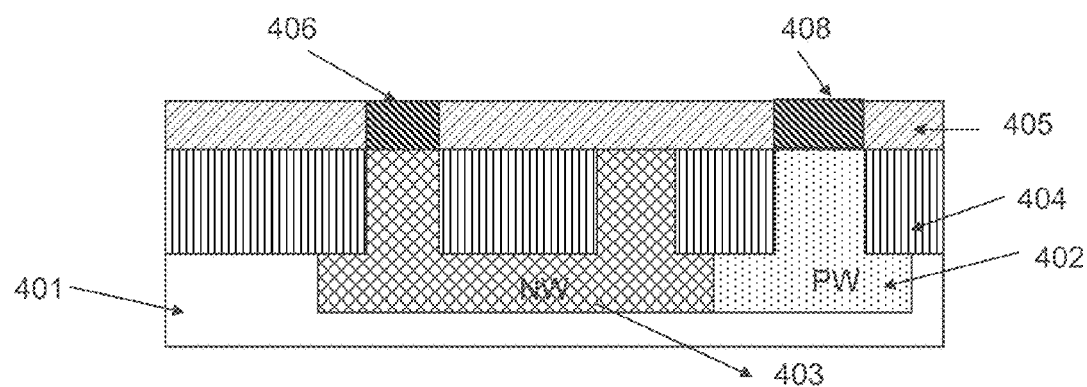

Next, referring to FIG. 5C, a boron-doped silicon germanium material is deposited on the exposed regions of the N-well 403 and the P-well 402, thereby forming the emitter 406 and the collector 408, respectively. In some preferred embodiments, the boron-doped silicon germanium material may be grown in-situ, thereby further simplifying the manufacturing process.

Figure 5D:
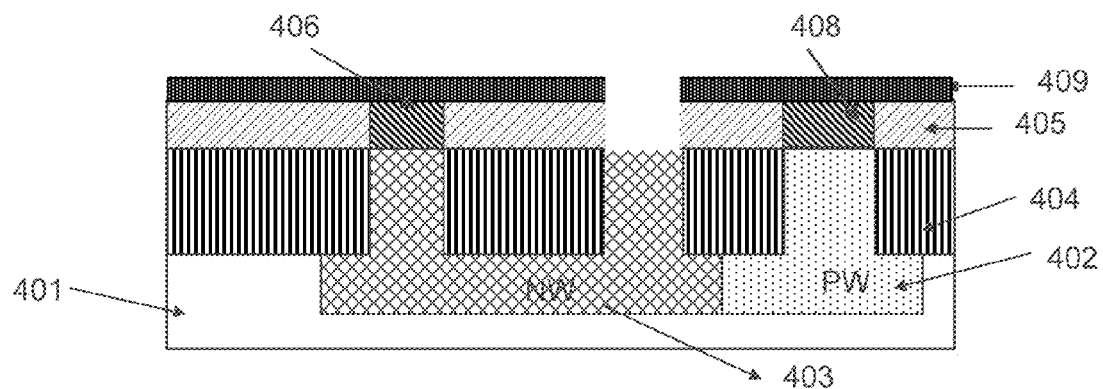

Next, referring to FIG. 5D, a mask layer 409 is deposited over the semiconductor substrate 401. An opening is then etched through the mask layer 409 and the insulating material 405, so as to expose a portion of the N-well 403 (corresponding to the region where the base 407 is to be formed).

Figure 5E:
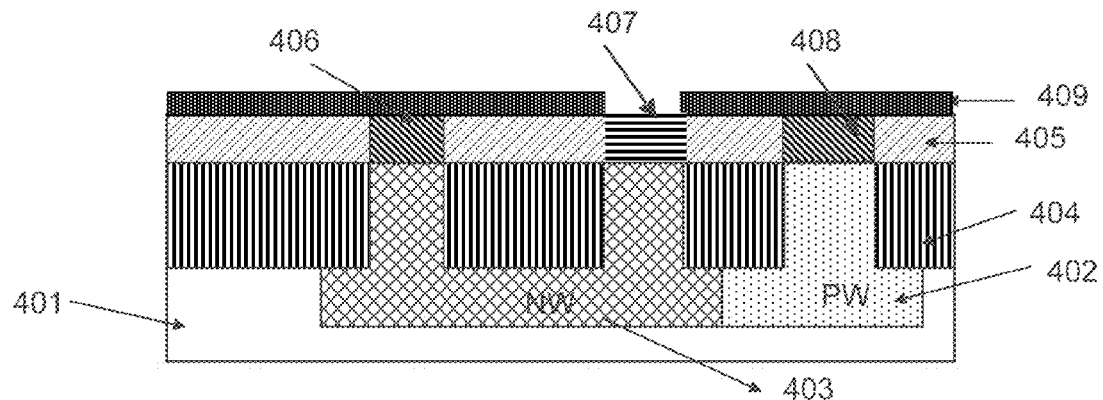

Next, referring to FIG. 5E, phosphorus-doped SiC is deposited on the exposed portion of the N-well 403, so as to form the base 407. Accordingly, a PNP transistor is formed.

Next, an NPN transistor and manufacturing method thereof will be described with reference to FIGS. 6 and 7A to 7F.

Figure 6:
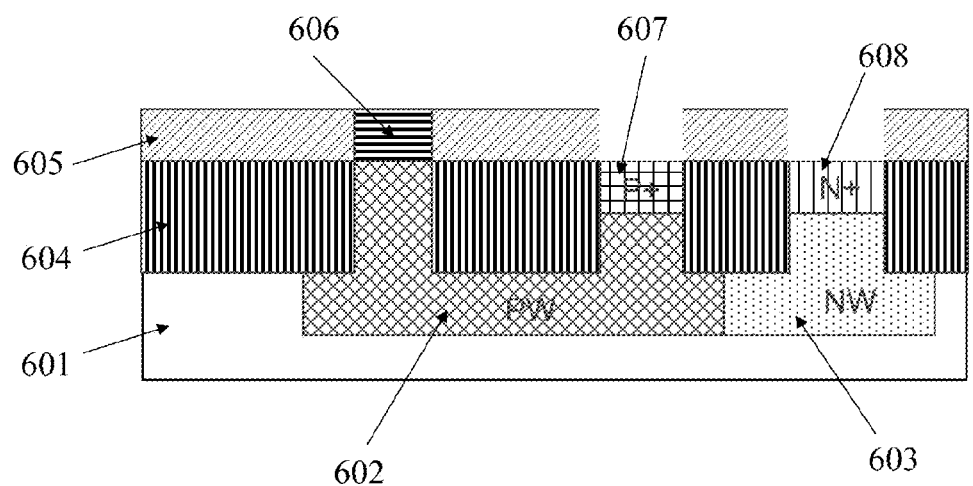
FIG. 6 illustrates a schematic cross-sectional view of a transistor according to another embodiment of the inventive concept.

FIG. 6 illustrates a schematic cross-sectional view of an NPN transistor according to an embodiment of the inventive concept. Referring to FIG. 6, the NPN transistor includes a P-well (PW) 602 and an N-well (NW) 603 formed in a semiconductor substrate 601. In the NPN transistor of FIG. 6, an emitter 606 and a base 607 are formed on the P-well 602 and a collector 608 is formed on the N-well 603, unlike the PNP transistor of FIG. 4 in which the emitter 406 and the base 407 are formed on the N-well 403 and the collector 408 is formed on the P-well 402. Referring to FIG. 6, the emitter 606, the base 607, and the collector 608 are formed spaced apart with insulating materials 604/605 disposed therebetween. The emitter 606 may include phosphorus-doped SiC. Accordingly, a heterojunction is formed between the emitter 606 and the P-well 602.

FIGS. 7A to 7F are schematic cross-sectional views of the NPN transistor of FIG. 6 at different stages of fabrication according to an exemplary method of manufacturing the transistor of FIG. 6.

Figure 7A:
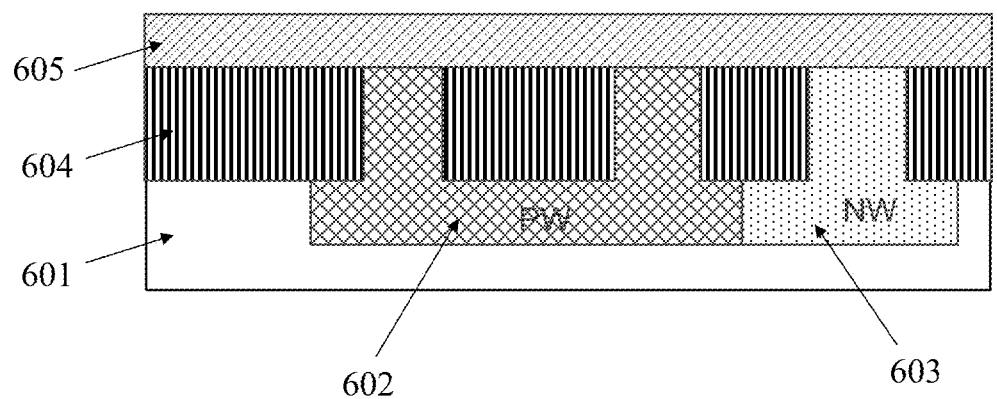
FIGS. 7A to 7F are schematic cross-sectional views of the transistor of FIG. 6 at different stages of fabrication according to an exemplary method of manufacturing the transistor of FIG. 6.

As shown in FIG. 7A, the P-well (PW) 602 and the N-well (NW) 603 are formed in the semiconductor substrate 601. The emitter 606, the base 607, and the collector 608 are to be spaced apart with an insulating material 604 disposed therebetween. A layer of insulating material 605 (e.g., silicon oxide) is deposited over the semiconductor substrate 601. Since the P-well 602, N-well 603, and insulating materials 604/605 can be formed using processes known to those of ordinary skill in the art, further description of those processes shall be omitted.

Figure 7B:
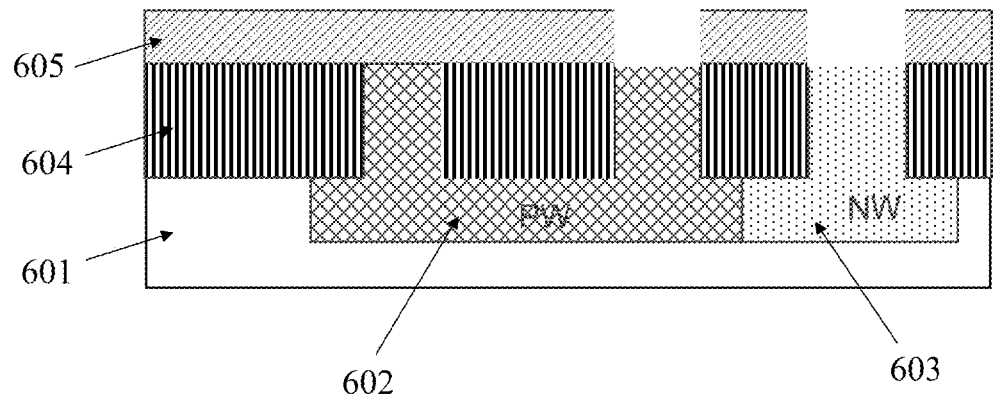

Next, referring to FIG. 7B, portions of the insulating material 605 are removed at regions corresponding to the (to-be-formed) base 607 and collector 608. The portions of the insulating material 605 can be removed using appropriate etching methods, such as dry etching or wet etching.

Figure 7C:
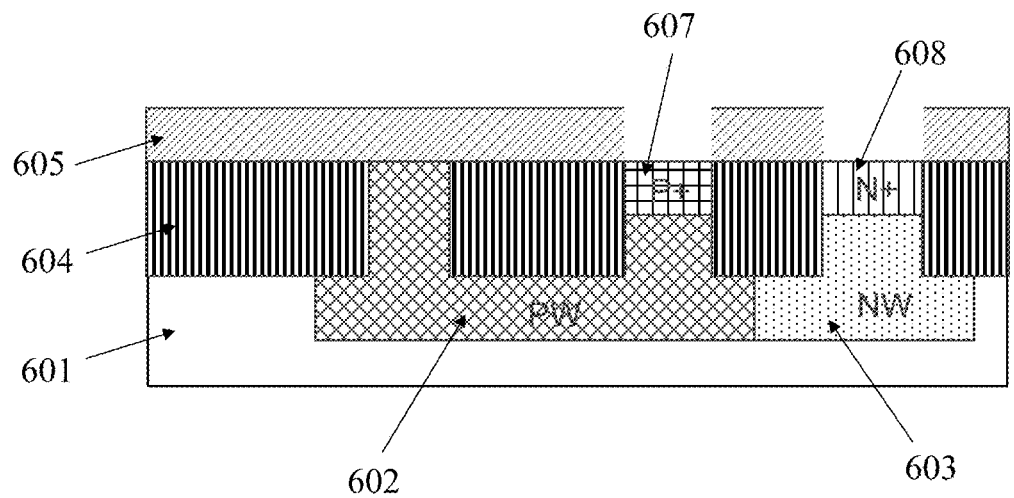

Next, referring to FIG. 7C, the base 607 and the collector 608 are formed by an ion implantation process. After the ion implantation process, the concentration of the p-type impurity in the base 607 is higher than the concentration of the p-type impurity in the P-well 602, and the concentration of the n-type impurity in the collector 608 is higher than the concentration of the n-type impurity in the N-well 603. As shown in FIG. 7C, the base 607 and the collector 608 are denoted by P+ and N+ regions, respectively.

Figure 7D:
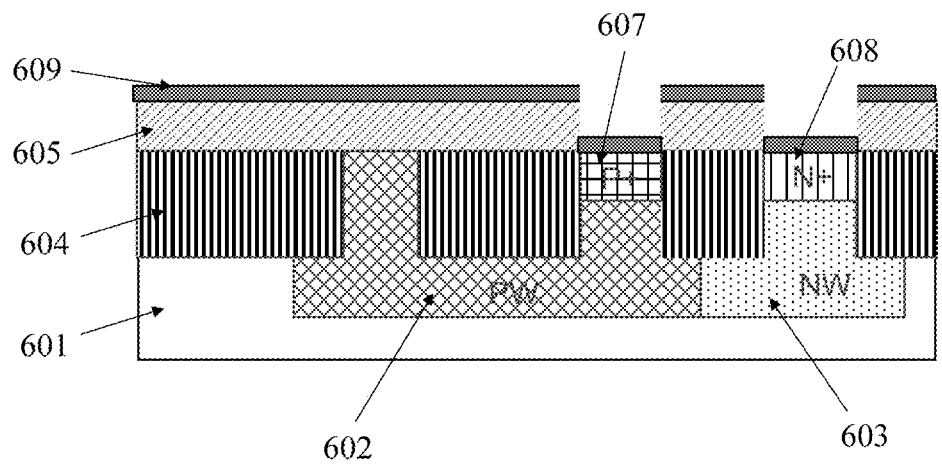

Next, referring to FIG. 7D, a mask layer 609 is deposited over the semiconductor substrate 601. Specifically, the mask layer 609 is deposited on the etched insulating material 605, and on the base 607 and collector 608.

Figure 7E:
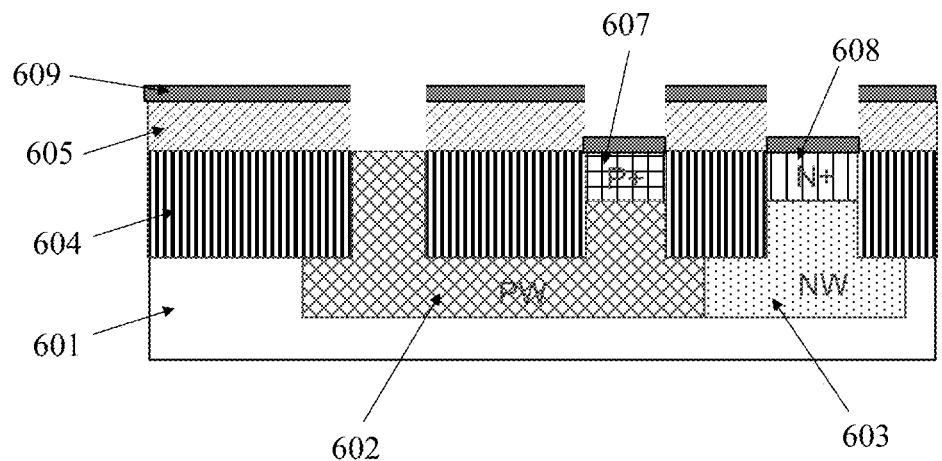

Next, referring to FIG. 7E, a portion of the mask layer 609 and the insulating material 605 is removed at a region corresponding to the (to-be-formed) emitter 606. The portion of the mask layer 609 and the insulating material 605 may be removed, for example, by an etching process.

Figure 7F:
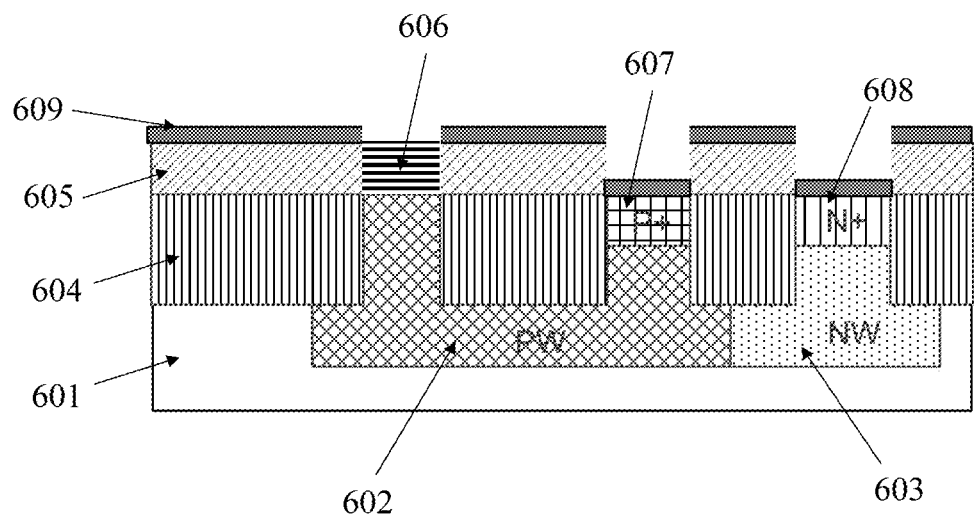

Next, referring to FIG. 7F, phosphorus-doped SiC is deposited on the exposed portion of the P-well 602, so as to form the emitter 606. In some embodiments, the phosphorus-doped SiC may be grown in-situ. Accordingly, an NPN transistor is formed having a heterojunction formed between the emitter 606 and the P-well 602.

Figure 8:
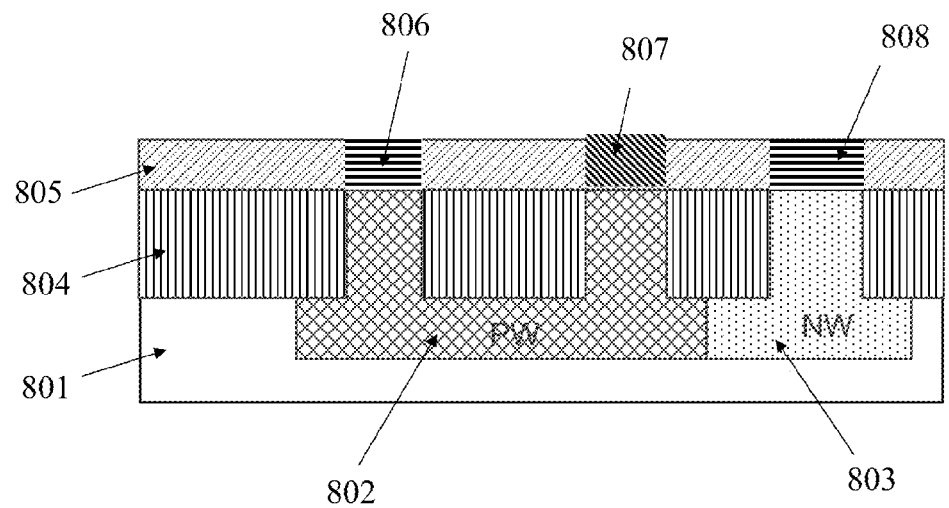
FIG. 8 illustrates a schematic cross-sectional view of a transistor according to another embodiment of the inventive concept.

FIG. 8 illustrates a schematic cross-sectional view of a heterojunction bipolar transistor structure according to another embodiment of the inventive concept.

Referring to FIG. 8, the heterojunction bipolar transistor includes a P-well (PW) 802 and an N-well (NW) 803 formed in a semiconductor substrate 801. An emitter 806 and a base 807 are formed on the P-well 802, and a collector 808 is formed on the N-well 803. The emitter 806, the base 807, and the collector 808 are formed spaced apart with insulating materials 804/805 disposed therebetween. In the example of FIG. 8, the emitter 806 and the collector 808 may include a boron-doped silicon germanium material, and the base 807 may include phosphorus-doped SiC.

FIGS. 9A to 9F are schematic cross-sectional views of the heterojunction bipolar transistor of FIG. 8 at different stages of fabrication according to an exemplary method of manufacturing the transistor of FIG. 8.

Figure 9A:
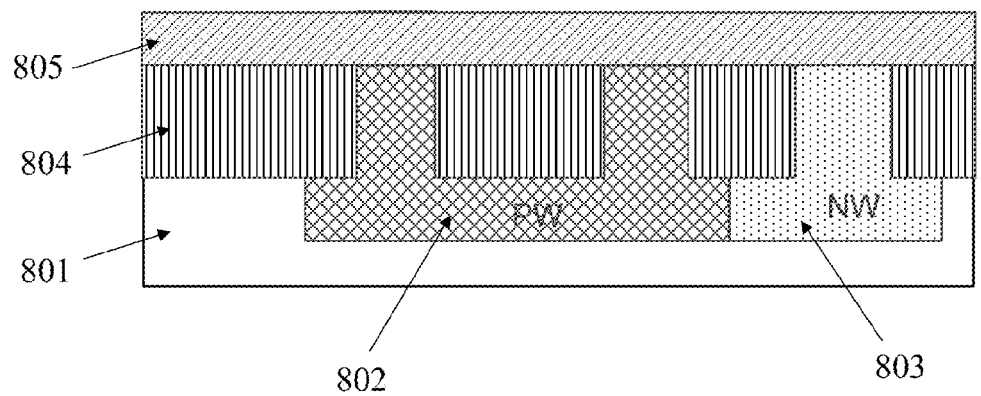
FIGS. 9A to 9F are schematic cross-sectional views of the transistor of FIG. 8 at different stages of fabrication according to an exemplary method of manufacturing the transistor of FIG. 8.

As shown in FIG. 9A, the P-well (PW) 802 and the N-well (NW) 803 are formed in the semiconductor substrate 801. The emitter 806, the base 807, and the collector 808 are to be spaced apart with the insulating material 804 disposed therebetween. A layer of insulating material 805 (e.g., silicon oxide) is deposited over the semiconductor substrate 801. Since the P-well 802, N-well 803, and insulating materials 804/805 can be formed using processes known to those of ordinary skill in the art, further description of those processes shall be omitted.

Figure 9B:
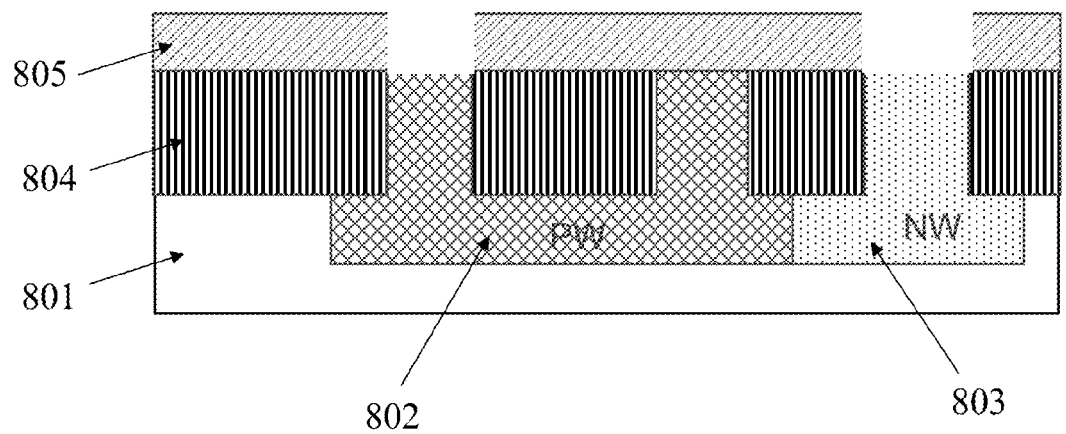

Next, referring to FIG. 9B, portions of the insulating material 805 are removed at regions corresponding to the (to-be-formed) emitter 806 and collector 808. The portions of the insulating material 805 can be removed using appropriate etching methods, such as dry etching or wet etching.

Figure 9C:
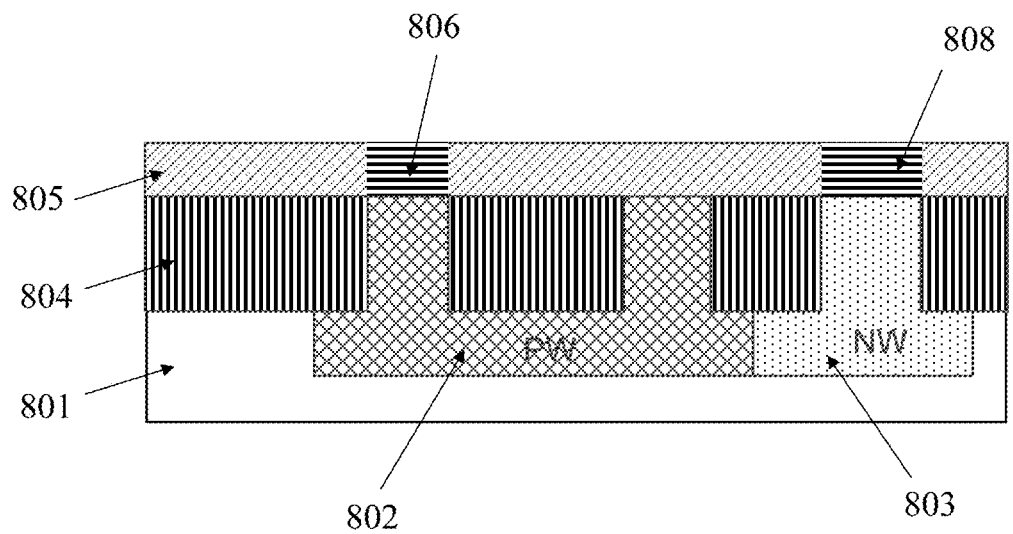

Next, referring to FIG. 9C, a boron-doped silicon germanium material is deposited on the exposed regions of the P-well 802 and the N-well 803, thereby forming the emitter 806 and the collector 808, respectively. In some preferred embodiments, the boron-doped silicon germanium material may be grown in-situ, thereby further simplifying the manufacturing process.

Figure 9D:
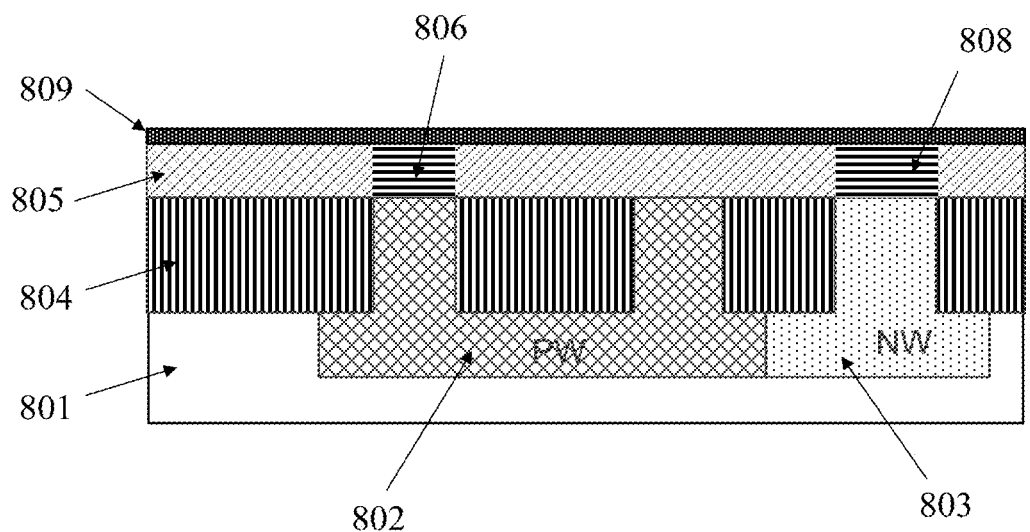

Next, referring to FIG. 9D, a mask layer 809 is deposited over the semiconductor substrate 801.

Figure 9E:
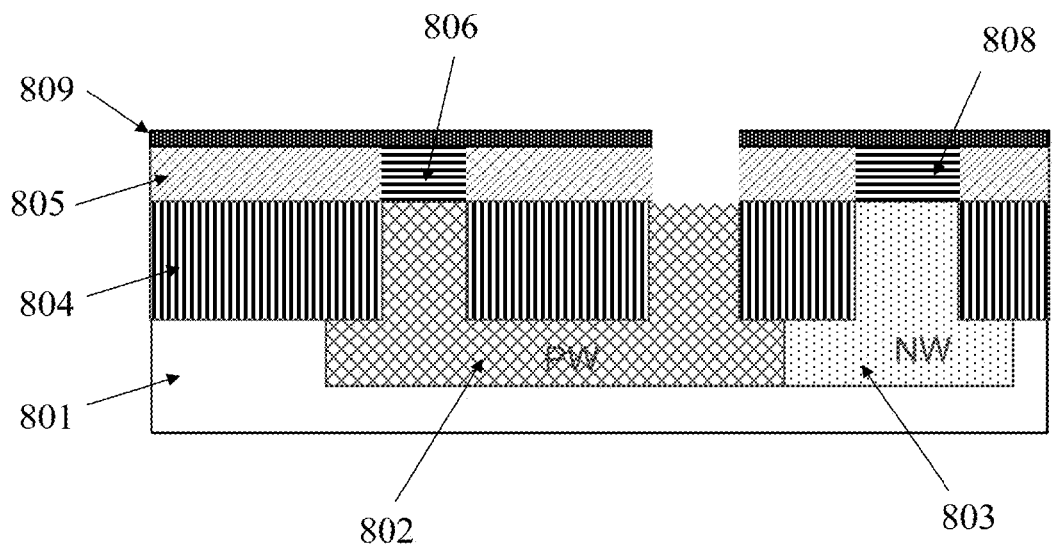

Next, referring to FIG. 9E, an opening is etched through the mask layer 809 and the insulating material 805, so as to expose a portion of the P-well 802 (corresponding to the region where the base 807 is to be formed).

Figure 9F:
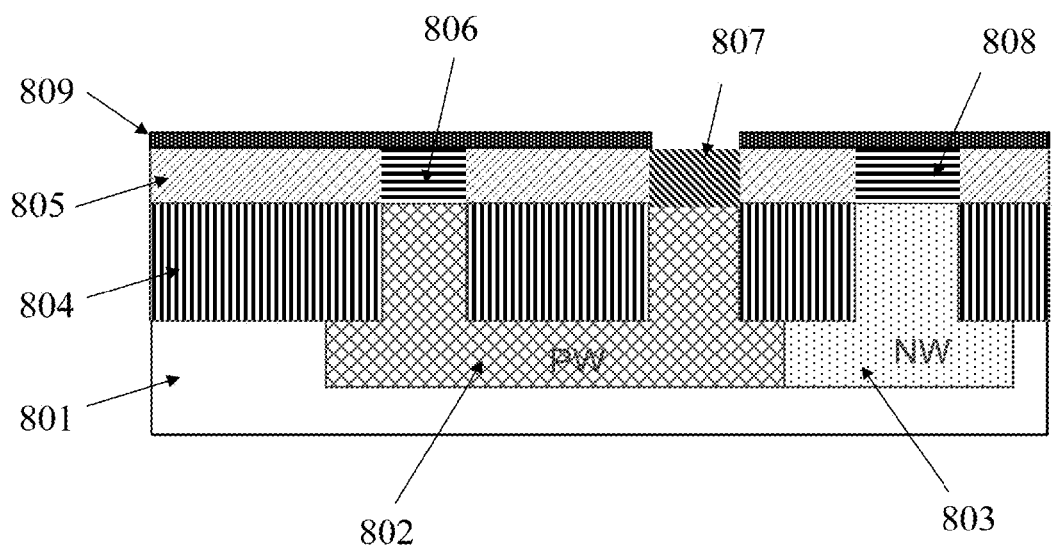

Next, referring to FIG. 9F, phosphorus-doped SiC is deposited on the exposed portion of the P-well 802, so as to form the base 807. Accordingly, a PNP transistor is formed.

Figure 10:
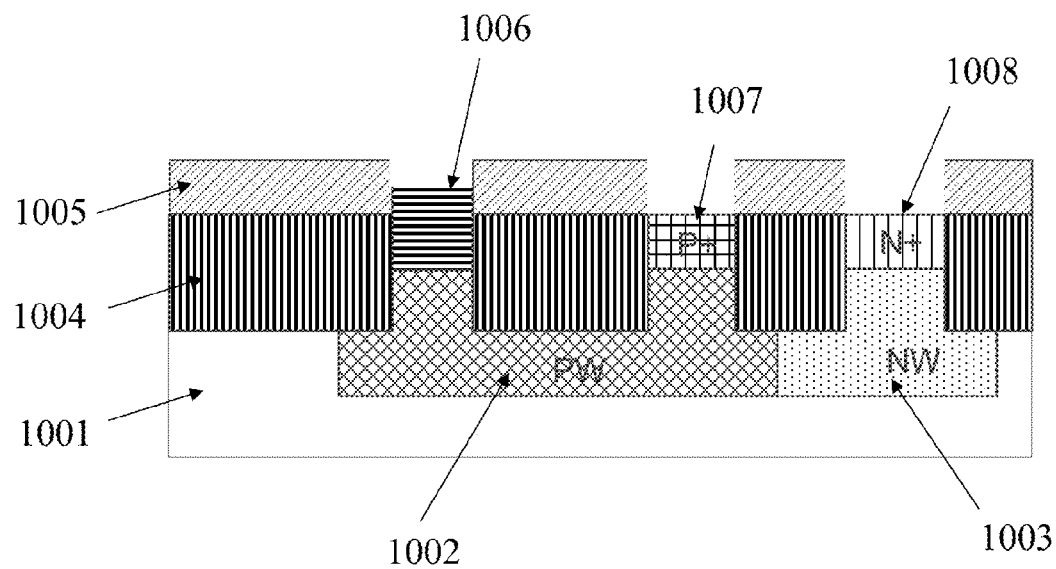
FIG. 10 illustrates a schematic cross-sectional view of a transistor according to another embodiment of the inventive concept.

FIG. 10 illustrates a schematic cross-sectional view of a heterojunction bipolar transistor structure according to another embodiment of the inventive concept.

The embodiment of FIG. 10 is similar to the embodiment of FIG. 6 except for the following differences. In the embodiment of FIG. 10, a bottom portion of an emitter 1006 extends into a space between adjacent portions of an insulating material 1004. In some embodiments, a bottom surface of the emitter 1006 may be disposed at a same height as the respective bottom surfaces of a base 1007 and a collector 1008. Since the embodiments of FIGS. 6 and 10 are similar in other aspects, a detailed description of those similar aspects shall be omitted.

FIGS. 11A to 11F are schematic cross-sectional views of the heterojunction bipolar transistor structure of FIG. 10 at different stages of fabrication according to an exemplary method of manufacturing the transistor of FIG. 10.

The process steps and elements corresponding to FIGS. 11A to 11D are similar to those previously described in FIGS. 7A to 7D. Accordingly, a detailed description of those similar steps and elements shall be omitted.

Figure 11A:
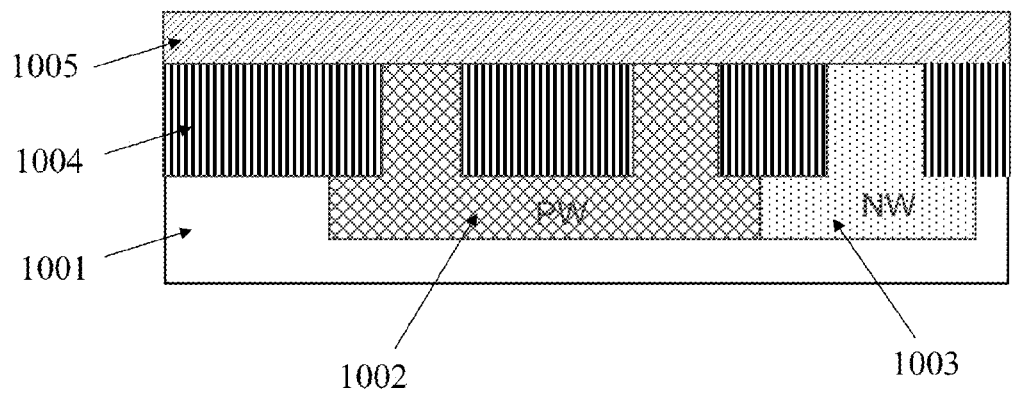
FIGS. 11A to 11F are schematic cross-sectional views of the transistor of FIG. 10 at different stages of fabrication according to an exemplary method of manufacturing the transistor of FIG. 10.
Figure 11B:
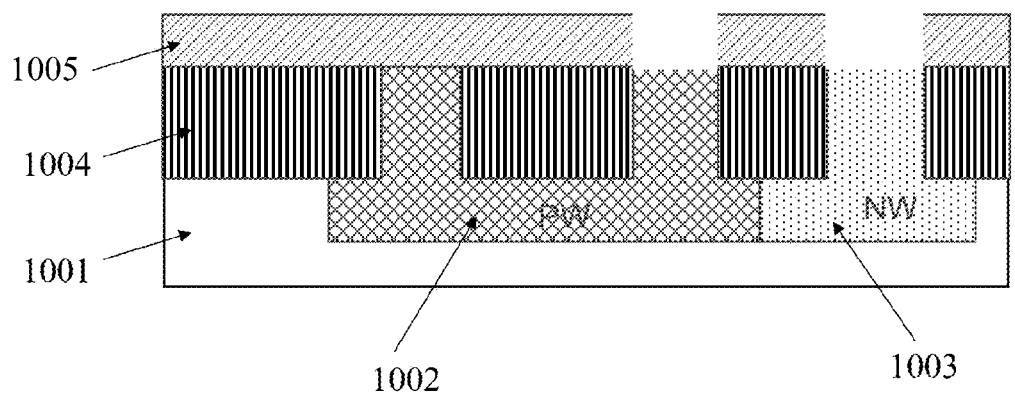
Figure 11C:
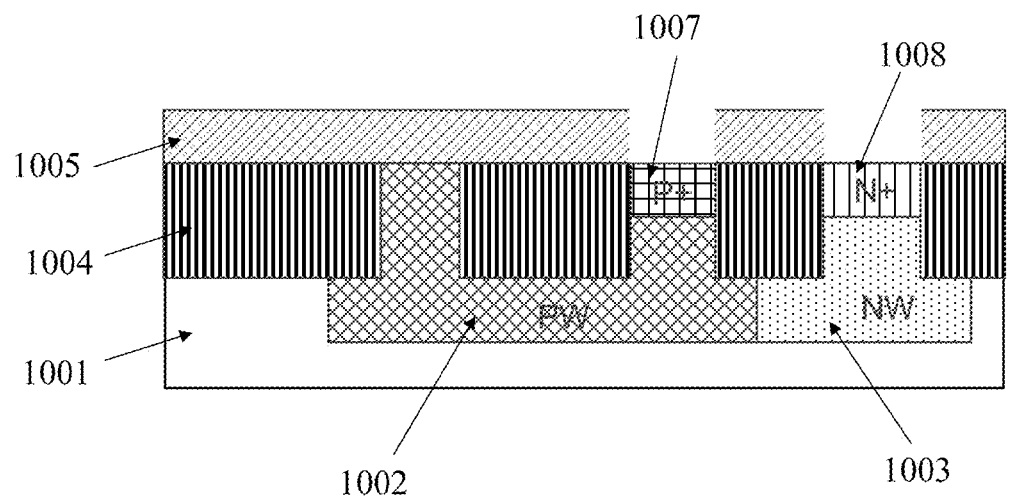
Figure 11D:
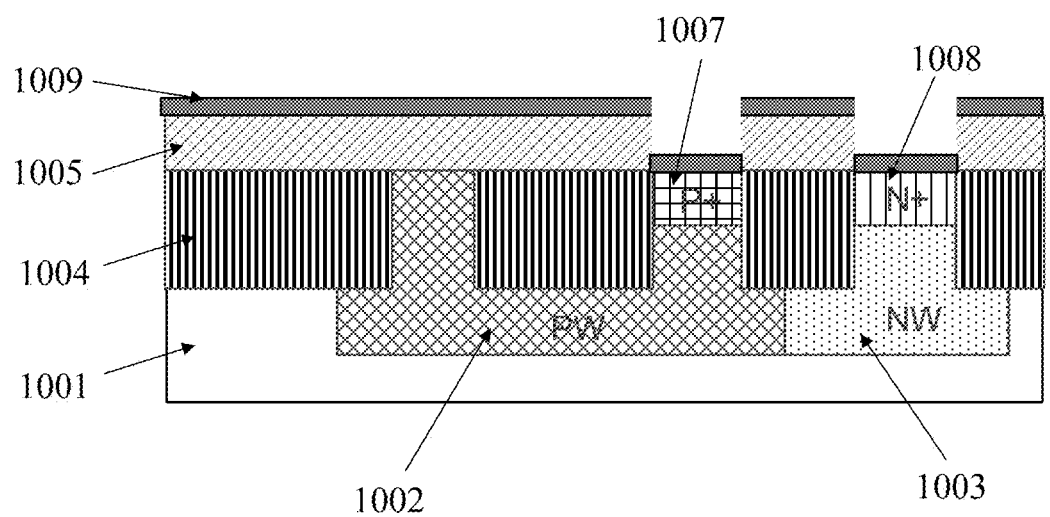
Figure 11E:
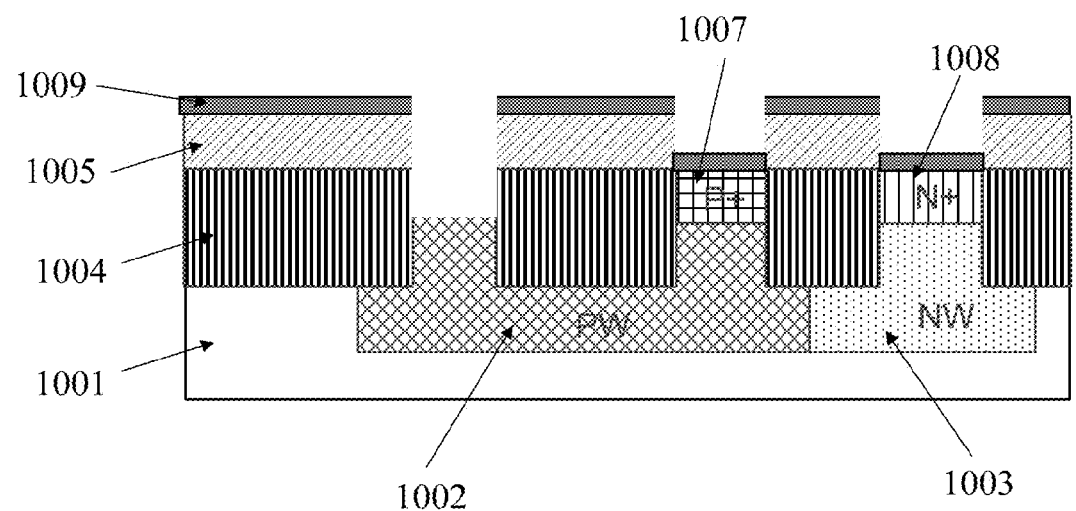

Referring to FIG. 11E, a portion of a mask layer 1009 and insulating materials 1004/1005 is removed at a region corresponding to the (to-be-formed) emitter 1006. The portion of the mask layer 1009 and the insulating materials 1004/1005 may be removed, for example, by an etching process. As shown in FIG. 11E, a portion of the P-well 1002 is exposed after the etching. In some embodiments, a surface of the exposed portion of the P-well 1002 is substantially at a same height as the respective bottom surfaces of the base 1007 and the collector 1008.

Figure 11F:
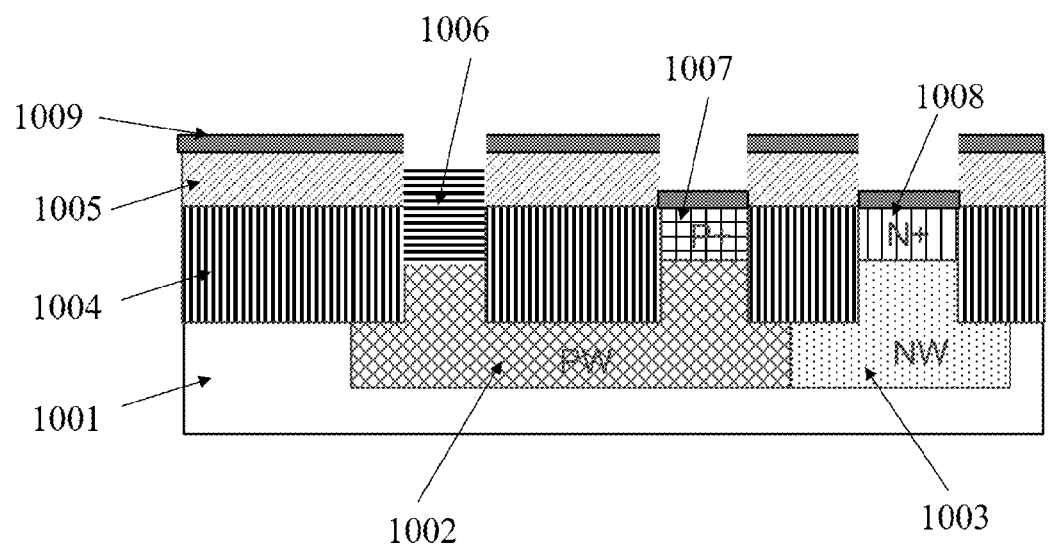

Next, referring to FIG. 11F, boron-doped SiC is deposited on the exposed portion of the P-well 1002, so as to form the emitter 1006. In some embodiments, the boron-doped SiC may be grown in-situ.

Figure 12:
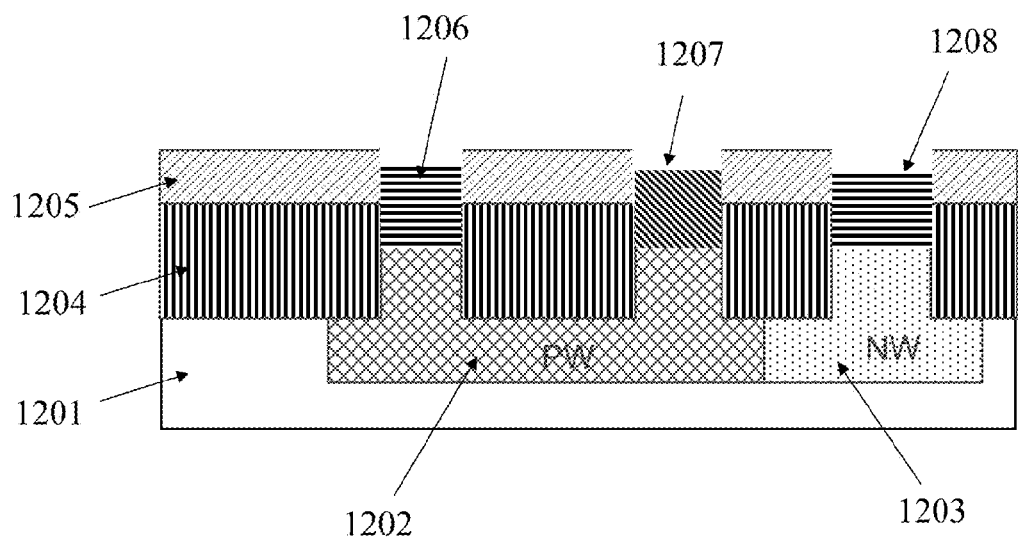
FIG. 12 illustrates a schematic cross-sectional view of a transistor according to another embodiment of the inventive concept.

FIG. 12 illustrates a schematic cross-sectional view of a heterojunction bipolar transistor structure according to another embodiment of the inventive concept.

The embodiment of FIG. 12 is similar to the embodiment of FIG. 8 except for the following differences. In the embodiment of FIG. 12, a lower portion of each of an emitter 1206, a base 1207, and a collector 1208 lies below a top surface of an insulating material 1204, and an upper portion of each of the emitter 1206, the base 1207, and the collector 1208 lies below a top surface of an insulating material 1205.

FIGS. 13A to 13F are schematic cross-sectional views of the heterojunction bipolar transistor structure of FIG. 12 at different stages of fabrication according to an exemplary method of manufacturing the transistor of FIG. 12.

Figure 13A:
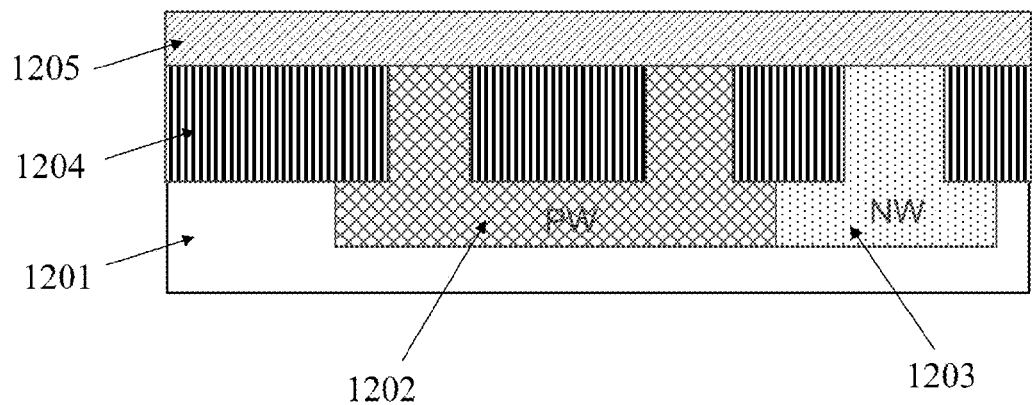
FIGS. 13A to 13F are schematic cross-sectional views of the transistor of FIG. 12 at different stages of fabrication according to an exemplary method of manufacturing the transistor of FIG. 12.

As shown in FIG. 13A, the P-well (PW) 1202 and the N-well (NW) 1203 are formed in the semiconductor substrate 1201. The emitter 1206, the base 1207, and the collector 1208 are to be spaced apart with the insulating material 1204 disposed therebetween. A layer of insulating material 1205 (e.g., silicon oxide) is deposited over the semiconductor substrate 1201. Since the P-well 1202, N-well 1203, and insulating materials 1204/1205 can be formed using processes known to those of ordinary skill in the art, further description of those processes shall be omitted.

Figure 13B:
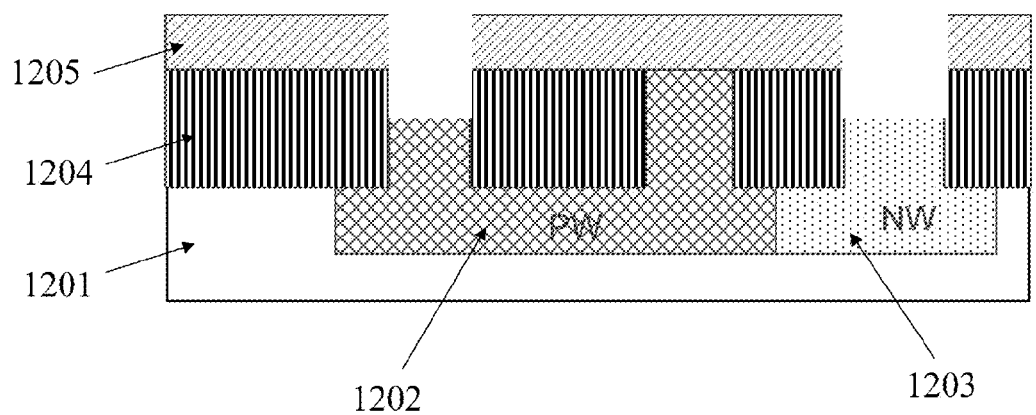

Next, referring to FIG. 13B, portions of the insulating materials 1204/1205 are removed at regions corresponding to the (to-be-formed) emitter 1206 and collector 1208. The portions of the insulating materials 1204/1205 can be removed using appropriate etching methods, such as dry etching or wet etching.

Figure 13C:
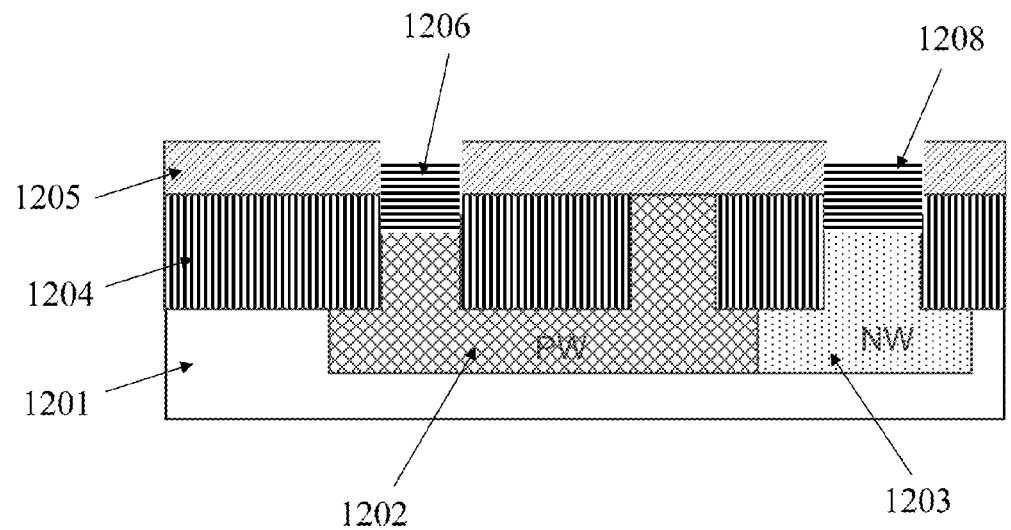

Next, referring to FIG. 13C, a boron-doped silicon germanium material is deposited on the exposed regions of the P-well 1202 and the N-well 1203, thereby forming the emitter 1206 and the collector 1208, respectively. In some preferred embodiments, the boron-doped silicon germanium material may be grown in-situ, thereby further simplifying the manufacturing process.

Figure 13D:
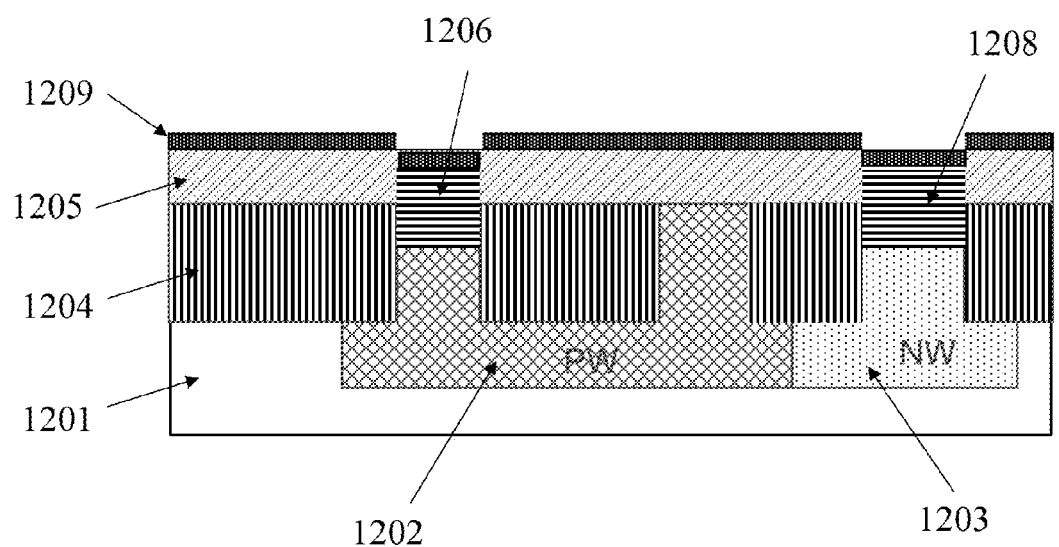

Next, referring to FIG. 13D, a mask layer 1209 is deposited over the semiconductor substrate 1201. Specifically, the mask layer 1209 is formed on the insulating materials 1204/1205, and the emitter 1206 and the collector 1208.

Figure 13E:
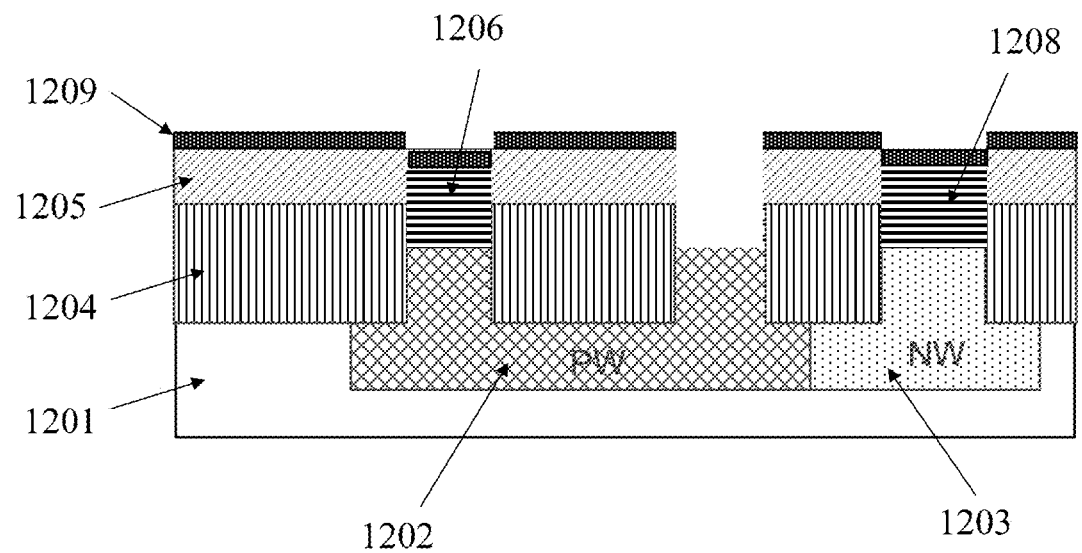

Next, referring to FIG. 13E, an opening is etched through the mask layer 1209 and the insulating materials 1204/1205, so as to expose a portion of the P-well 1202 (corresponding to the region where the base 1207 is to be formed).

Figure 13F:
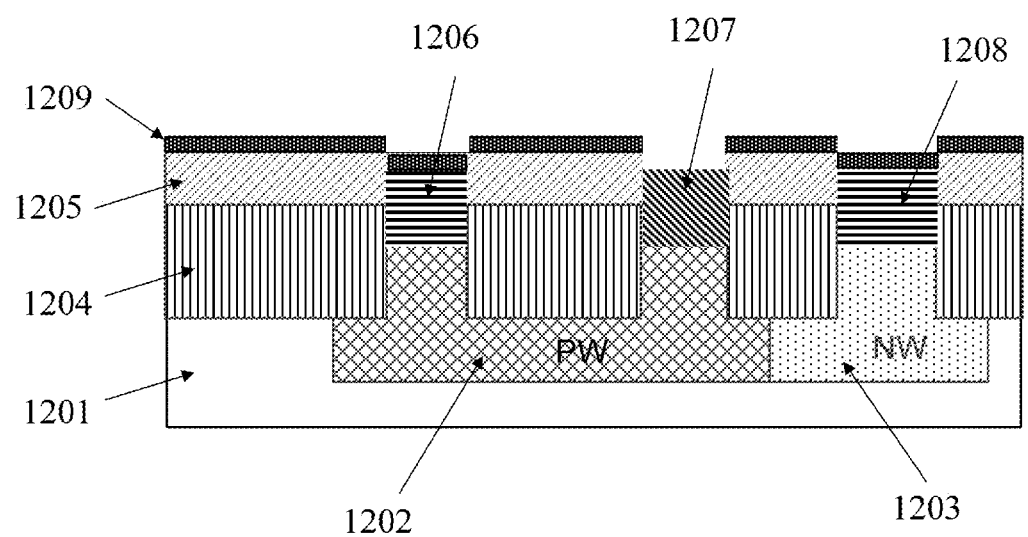

Next, referring to FIG. 13F, phosphorus-doped SiC is deposited on the exposed portion of the P-well 1202, so as to form the base 1207.

Embodiments of a semiconductor device and methods of manufacturing the semiconductor device have been described in the foregoing description. To avoid obscuring the inventive concept, details that are well-known in the art may have been omitted. Nevertheless, those skilled in the art would be able to understand the implementation of the inventive concept and its technical details in view of the present disclosure.

The different embodiments of the inventive concept have been described with reference to the accompanying drawings. However, the different embodiments are merely illustrative and are not intended to limit the scope of the inventive concept. Furthermore, those skilled in the art would appreciate that various modifications can be made to the different embodiments without departing from the scope of the inventive concept.

What is claimed is:

1. A transistor comprising:
   a semiconductor substrate comprising a first region and a second region;
   an emitter and a base disposed on the first region; and
   a collector disposed on the second region,
   wherein the emitter is disposed on an upper surface of the semiconductor substrate forming a heterojunction between the emitter and the upper surface of the semiconductor substrate,
   wherein the emitter and the base are spaced apart by a stacked layer including at least two different insulating materials, and
   wherein a junction between the at least two different insulating materials of the stacked layer has a substantially same height as a height of the heterojunction between the emitter and the upper surface of the semiconductor substrate.

2. The transistor according to claim 1, wherein the first region is doped with an n-type impurity and the second region is doped with a p-type impurity, the base is doped with the n-type impurity, and a concentration of the n-type impurity in the base is higher than a concentration of the n-type impurity in the first region.

3. The transistor according to claim 2, wherein the collector is doped with the p-type impurity, and a concentration of the p-type impurity in the collector is higher than a concentration of the p-type impurity in the second region.

4. The transistor according to claim 1, wherein the base includes phosphorous-doped silicon carbide and the emitter includes boron-doped silicon germanium.

5. The transistor of claim 4, wherein the collector includes the boron-doped silicon germanium.

6. The transistor according to claim 1, wherein the first region is doped with a p-type impurity and the second region is doped with an n-type impurity, the base is doped with the p-type impurity, and a concentration of the p-type impurity in the base is higher than a concentration of the p-type impurity in the first region.

7. The transistor according to claim 6, wherein the collector is doped with the n-type impurity, and a concentration of the n-type impurity in the collector is higher than a concentration of the n-type impurity in the second region.

8. The transistor according to claim 6, wherein the emitter includes phosphorous-doped silicon carbide.

9. The transistor according to claim 1, wherein the first region is doped with a p-type impurity and the second region is doped with an n-type impurity; and
   the emitter includes boron-doped silicon germanium.

10. The transistor according to claim 9, wherein the base includes phosphorous-doped silicon carbide.

11. The transistor according to claim 9, wherein the collector includes the boron-doped silicon germanium.

12. A method of manufacturing a transistor, comprising:
    forming a first region and a second region on a semiconductor substrate;
    forming an emitter on the first region and a collector on the second region; and
    forming a base on the first region,
    wherein the emitter is disposed on an upper surface of the semiconductor substrate forming a heterojunction between the emitter and the upper surface of the semiconductor substrate,
    wherein the emitter and the base are spaced apart by a stacked layer including at least two different insulating materials, and
    wherein a junction between the at least two different insulating materials of the stacked layer has a substantially same height as a height of the heterojunction between the emitter and the upper surface of the semiconductor substrate.

13. The method according to claim 12, wherein the first region is doped with an n-type impurity and the second region is doped with a p-type impurity, the base is doped with the n-type impurity, and a concentration of the n-type impurity in the base is higher than a concentration of the n-type impurity in the first region.

14. The method according to claim 13, wherein the collector is doped with the p-type impurity, and a concentration of the p-type impurity in the collector is higher than a concentration of the p-type impurity in the second region.

15. The method according to claim 12, wherein the base includes phosphorous-doped silicon carbide, and the collector and the emitter include boron-doped silicon germanium.

16. The method according to claim 12, wherein the first region is doped with a p-type impurity and the second region is doped with an n-type impurity;
    and the emitter includes phosphorus-doped silicon carbide.

17. The method of claim 16, wherein the base is doped with the p-type impurity, and a concentration of the p-type impurity in the base is higher than a concentration of the p-type impurity in the first region.

18. The method according to claim 16, wherein the collector is doped with the n-type impurity, and a concentration of the n-type impurity in the collector is higher than a concentration of the n-type impurity in the second region.

19. A method of manufacturing a transistor, comprising:
    forming a first region and a second region on a semiconductor substrate,
    wherein the first region is doped with a p-type impurity and the second region is doped with an n-type impurity;
    forming an emitter on the first region and a collector on the second region,
    wherein the emitter includes boron-doped silicon germanium; and
    forming a base on the first region,
    wherein the emitter is disposed on an upper surface of the semiconductor substrate forming a heterojunction between the emitter and the upper surface of the semiconductor substrate,
    wherein the emitter and the base are spaced apart by a stacked layer including at least two different insulating materials, and
    wherein a junction between the at least two different insulating materials of the stacked layer has a substantially same height as a height of the heterojunction between the emitter and the upper surface of the semiconductor substrate.

20. The method according to claim 19, wherein the base includes phosphorous-doped silicon carbide and the collector includes the boron-doped silicon germanium.

* * * * *